United States Patent [19]
Hurd

[11] Patent Number: 6,104,191
[45] Date of Patent: Aug. 15, 2000

[54] QUANTITATIVE IN VIVO SPECTROSCOPY USING OVERSAMPLING, WATERLINE REFERENCING, AND PRIOR KNOWLEDGE FITTING

[75] Inventor: Ralph E. Hurd, Milpitas, Calif.

[73] Assignee: General Electric Company, Milwaukee, Wis.

[21] Appl. No.: 09/040,648

[22] Filed: Mar. 17, 1998

[51] Int. Cl.[7] ................................................. G01V 3/00
[52] U.S. Cl. ........................ 324/310; 324/309; 324/307; 600/410
[58] Field of Search ................... 324/310, 309, 324/307; 600/410

[56] References Cited

U.S. PATENT DOCUMENTS

| | | | |
|---|---|---|---|
| 4,480,228 | 10/1984 | Bottomley | 324/309 |
| 4,962,357 | 10/1990 | Sotak | 324/309 |
| 5,537,039 | 7/1996 | Le Roux et al. | 324/309 |
| 5,657,758 | 8/1997 | Posse et al. | 324/307 |

OTHER PUBLICATIONS

Lawrence N. Ryner, James A. Sorenson, and M. Albert Thomas, "Localized 2D J–Resolved [1] H MR Spectroscopy: Strong Coupling Effects In Vitro and In Vivo", Magnetic Resonance Imaging, vol. 13, No. 6, pp. 853–869, 1995 (Pergamon).

Primary Examiner—Christine K. Oda
Assistant Examiner—Tiffany A. Fetzner
Attorney, Agent, or Firm—Townsend and Townsend and Crew; Christian G. Cabou; Phyllis Y. Price

[57] ABSTRACT

Disclosed is improved quantitative in vivo spectroscopy by means of F1-oversampled J-Resolved 2D spectroscopy. Reconstruction makes full use of internal signals for 2D water lineshape, $T_2$ and partial volume correction, and analysis uses 2D complex model spectra fitting. The preferred embodiment of the new method integrates these features into PRESS localized brain spectroscopy and is carried out without the need for water suppression.

7 Claims, 8 Drawing Sheets

Braino II
(5mm GABA added
to original formula)

FIG. 7B

Braino

FIG. 7C

Occipital lobe

QUANTITATIVE IN VIVO SPECTROSCOPY USING OVERSAMPLING, WATERLINE REFERENCING, AND PRIOR KNOWLEDGE FITTING

BACKGROUND OF THE INVENTION

This invention relates generally to magnetic resonance spectroscopy, and more particularly, the invention relates to volume spectroscopy in which water baseline artifact signal is reduced.

Volume localized magnetic resonance spectroscopy has become a useful and routine clinical tool especially for the detection of abnormalities which lead to diffused chemical changes in the brain. Several techniques are known for directly exciting spins in a volume of interest and achieving three-dimensional selection including use of stimulated echoes and the use of Carr-Purcell echoes. These techniques obtain a localized spectrum in a single scan. For example, point resolved spectroscopy (PRESS, see U.S. Pat. No. 4,480,228) uses a three pulse sequence with each pulse being frequency selective.

Many important clinical applications of proton magnetic resonance spectroscopy are based on the use of a restricted volume of excitation. Typically, the volume excitation is achieved using PRESS, which takes advantage of three orthogonal slices in the form of a double spin echo to select a specific region of interest.

There is a strong desire for absolute quantitation of localized proton spectroscopy of brain. This is an imposing task complicated by severe overlap of signals, baseline artifacts from spurious side bands of residual water, unknown $T_2$ losses, and in some cases partial volume issues. Although there are a number of independent approaches to eliminating artifacts, simplifying or editing spectra, $T_2$ estimation, and partial volume correction, there is a great deal of error and inefficiency in combining these methods to extract all of the desired information.

Ryner et al. "LOCALIZED 2D J-RESOLVED $^1$H MR SPECTROSCOPY: STRONG COUPLING EFFECTS IN VITRO AND IN VIVO," *Magnetic Resonance Imaging*, Vol. 13, No. 6, pp 853–869, 1995, disclose a two-dimensional (2D) J-resolved MR spectroscopy sequence (2D J-PRESS), fully localized in three dimensions, implemented on a whole-body MR scanner. As described by Ryner et al., transverse magnetization created by a 90° RF pulse can be refocused with a 180° RF pulse to create a spin-echo after an evolution during the echo time TE. Linear interactions like a chemical shift, static field inhomogeneity, resonance offset, etc., are averaged out during TE. The decay of the transverse magnetization is solely due to $T_2$ relaxation, neglecting effects due to spin diffusion and chemical exchange. Bilinear interactions, namely J-coupling, are unaffected by the refocusing pulse, leading to J-modulation of the magnetization during TE.

The 2D J-resolved sequence was first demonstrated over two decades ago, using a conventional spin-echo pulse scheme on a high-resolution NMR spectrometer. The processing as a 2D J-resolved data set includes Fourier transform along two axes (t1, t2) with chemical shift and J-coupling frequencies present along the resulting F2 axis and J-coupling frequencies separated along the resulting F1 axis.

SUMMARY OF THE INVENTION

The present invention achieves an improved quantitative in vivo spectroscopy by means of F1-oversampled J-Resolved 2D spectroscopy. Oversampling of F1 makes it possible to resolve and filter out interfering water sidebands, and thereby allow for the simultaneous acquisition of the full water and metabolite signals. Without baseline artifacts, the full water signal is used as a 2D lineshape reference, and is further used for $T_2$ and partial volume correction. The resulting "artifact free" phase sensitive 2D J Resolved spectra are fit with 2D phase sensitive model spectra. The preferred embodiment of the new method integrates these features into PRESS localized brain spectroscopy and is carried out without the need for water suppression.

More particularly, the method of magnetic resonance spectroscopy comprises the steps of a) placing an object in a magnetic field, b) generating and refocusing transverse magnetization to create echo signals at an echo time, TE, c) incrementing TE in steps to acquire a 2D (t1, t2) data set, and d) processing the data set to obtain chemical shift and J-coupling frequencies along an F2 axis and J-coupling frequencies along an F1 axis.

Step c) increments TE in a F1 bandwidth significantly greater than the bandwidth of proton-proton J coupling. A 2D water signal is resolved and can be used for 2D phase correction of the spectrum as a function of t2 both prior to and after FFT in F1. Further, a complete phase sensitive (F1, F2) map can be used to fit to phase sensitive (F1, F2) model spectra.

The invention and objects and features thereof will be more readily apparent from the following detailed description and appended claims when taken with the drawings.

DETAILED DESCRIPTION OF THE ILLUSTRATED EMBODIMENT

Figure 1A:
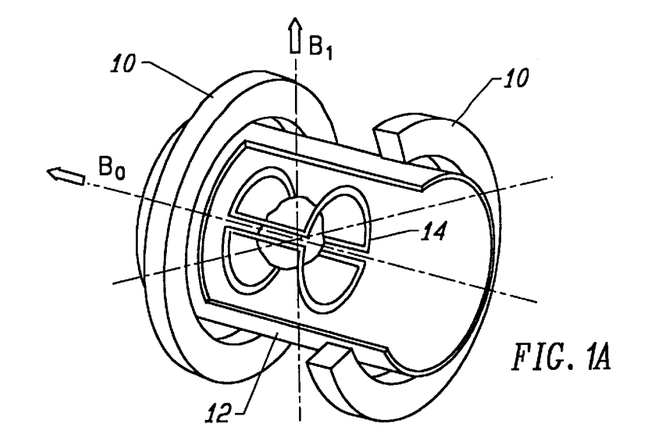
FIGS. 1A–1D illustrate the arrangement of conventional MRI apparatus and magnetic fields generated therein.
Figures 1B, 1C:
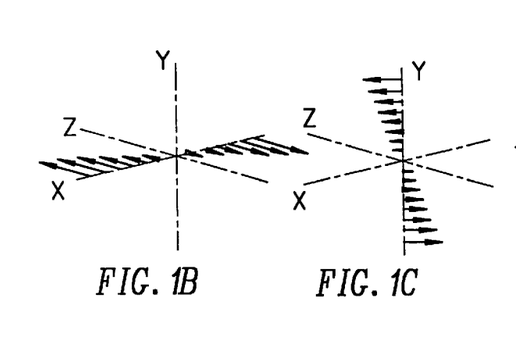
Figure 1D:
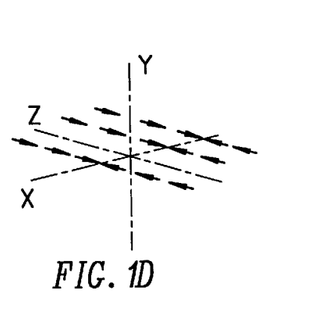

Referring now to the drawings, FIG. 1A is a perspective view partially in section illustrating coil apparatus in an MRI system, and FIGS. 1B–1D illustrate field gradients which can be produced in the apparatus of FIG. 1A. This apparatus is discussed in Hinshaw and Lent, "An Introduction to NMR Imaging: From the Bloch Equation to the Imaging Equation," *Proceedings of the IEEE*, Vol. 71, No. 3, March 1993, pps. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by an RF coil 14. A sample being studied would be positioned along the Z axis within the RF coil 14.

In FIG. 1B, an X gradient field is shown which is perpendicular to the static magnetic field $B_0$ and varies linearly with distance along the X axis but does not vary with distance along the Y or Z axes. FIGS. 1C and 1D are similar representations of the Y gradient and Z gradient fields, respectively.

Figure 2:
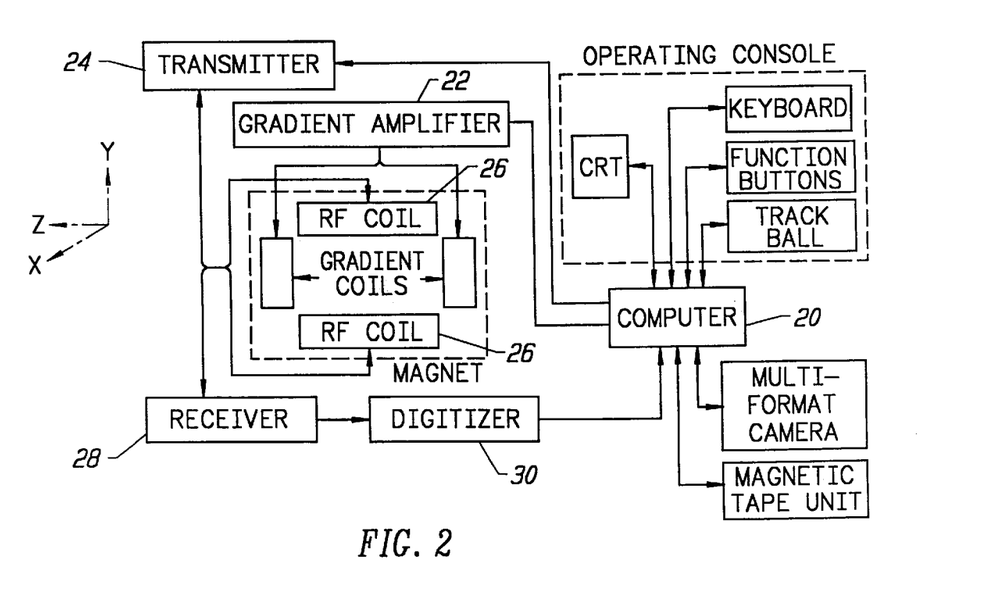
FIG. 2 is a functional block diagram of MRI and spectroscopy apparatus.

FIG. 2 is a functional block diagram of NMR apparatus. A computer 20 is programmed to control the operation of the MRI apparatus and process FID signals detected therefrom. The gradient field is energized by a gradient amplifier 22, and the RF coils for generating $B_1$ field at the Larmour frequency are controlled by the transmitter 24 and the RF coils 26. After the selected nuclei have been excited, the RF coils 26 are employed to detect the FID signal which is passed to the receiver 28 and then through digitizer 30 for processing computer 20.

Ryner et al., supra, describe a localized 2-D J-resolved (2-D J-PRESS) sequence using a 180° RF pulse to create a spin echo with an evolution time TE. While linear interactions such as chemical shift, static field inhomogeneity and resonance offset are averaged out during TE, bilinear interactions such as J-coupling are unaffected by the refocusing pulse.

In accordance with the invention, 2D J-Resolved spectra can be obtained by incrementing TE in the standard asymmetric PRESS sequence as 128 steps of 2.5 ms duration for a F1 bandwidth of +/−200 Hz (in practice this can be reduced to 64 steps of 5 ms for a bandwidth of +/−100 Hz in F1 since the bandwidth outside of +/−12 Hz can also capture the fold over artifact frequencies). This results in approximately 3 Hz resolution in F1 which is sufficient to resolve the characteristic couplings of the metabolites. For PRESS a typical initial TE=35 ms and a final TE=355 ms. SNR is roughly equivalent to a TE 144 PRESS scan for uncoupled spins, but is much more favorable for the coupled spins; this is especially true for coupled spins buried in the short echo 1D spectra.

Figure 3:
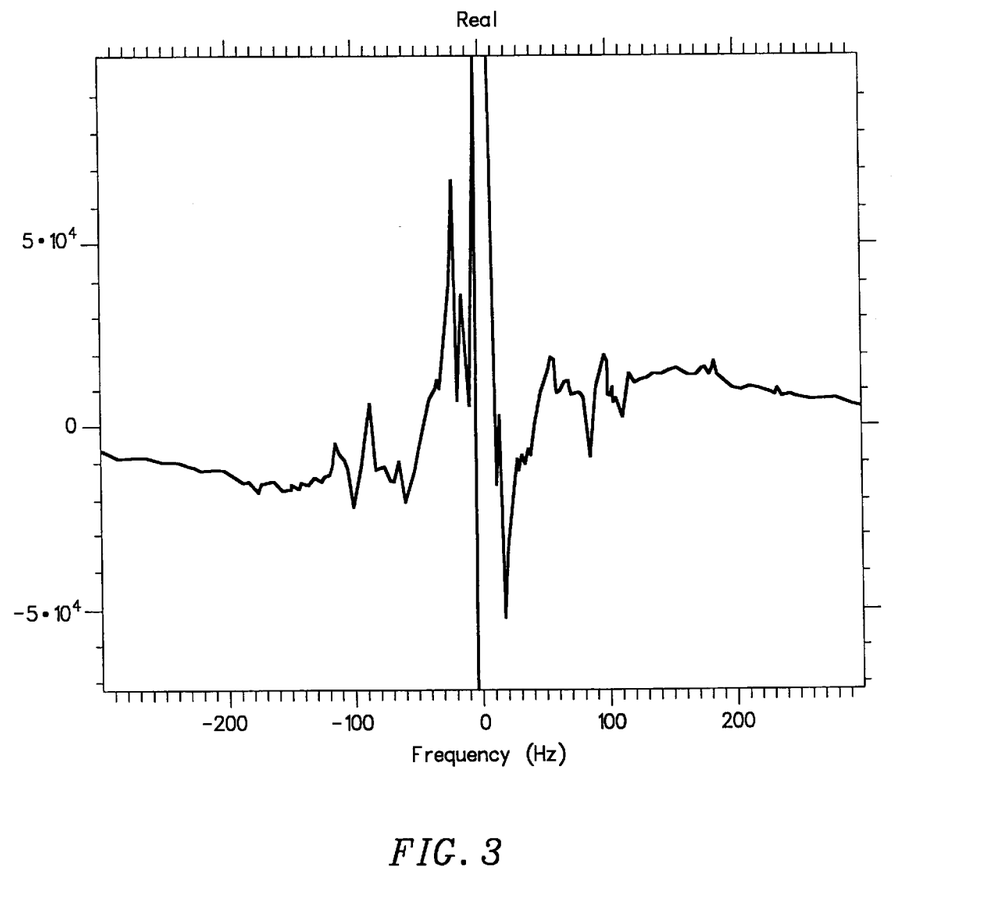
FIG. 3 is a PRESS spectrum of MRS HD sphere without water suppression.
Figure 4:
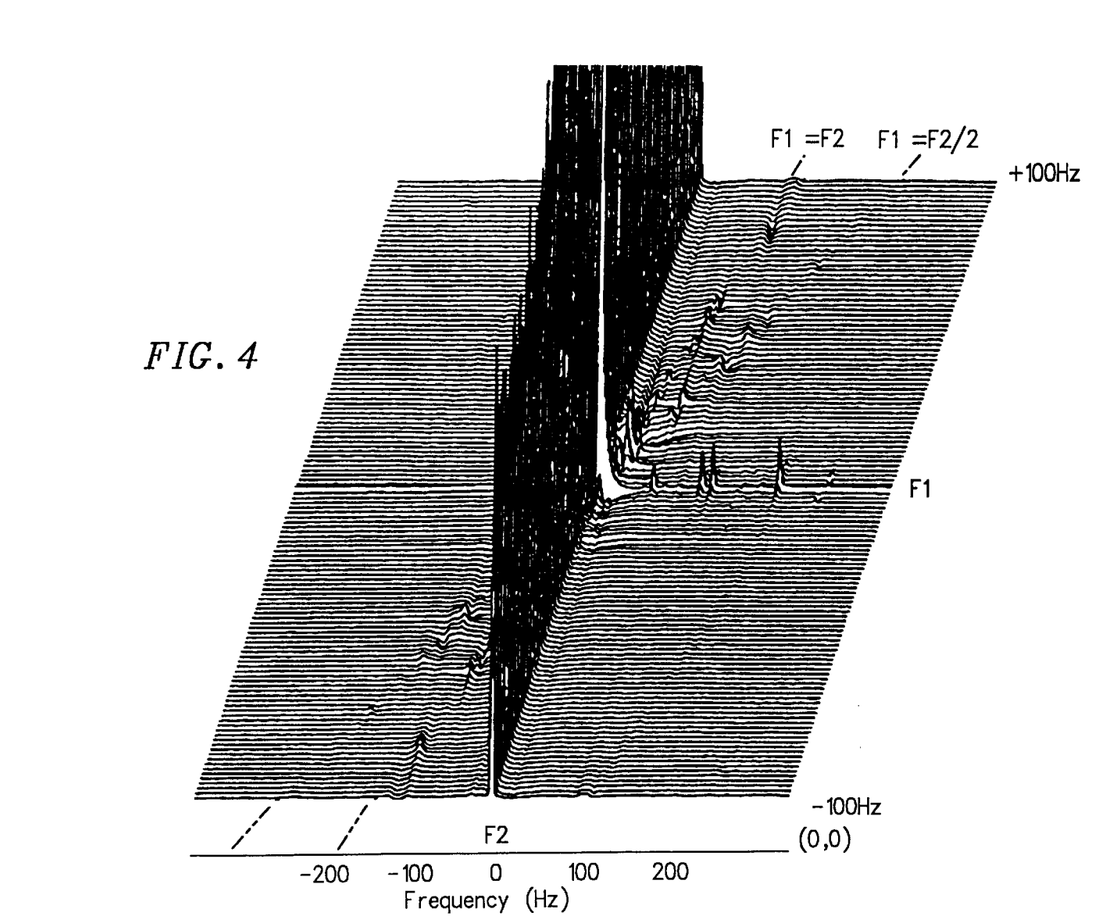
FIG. 4 is a Stack plot of an oversampled J-Resolved 2D PRESS spectrum of the MRS HD sphere without water suppression.
Figure 5:
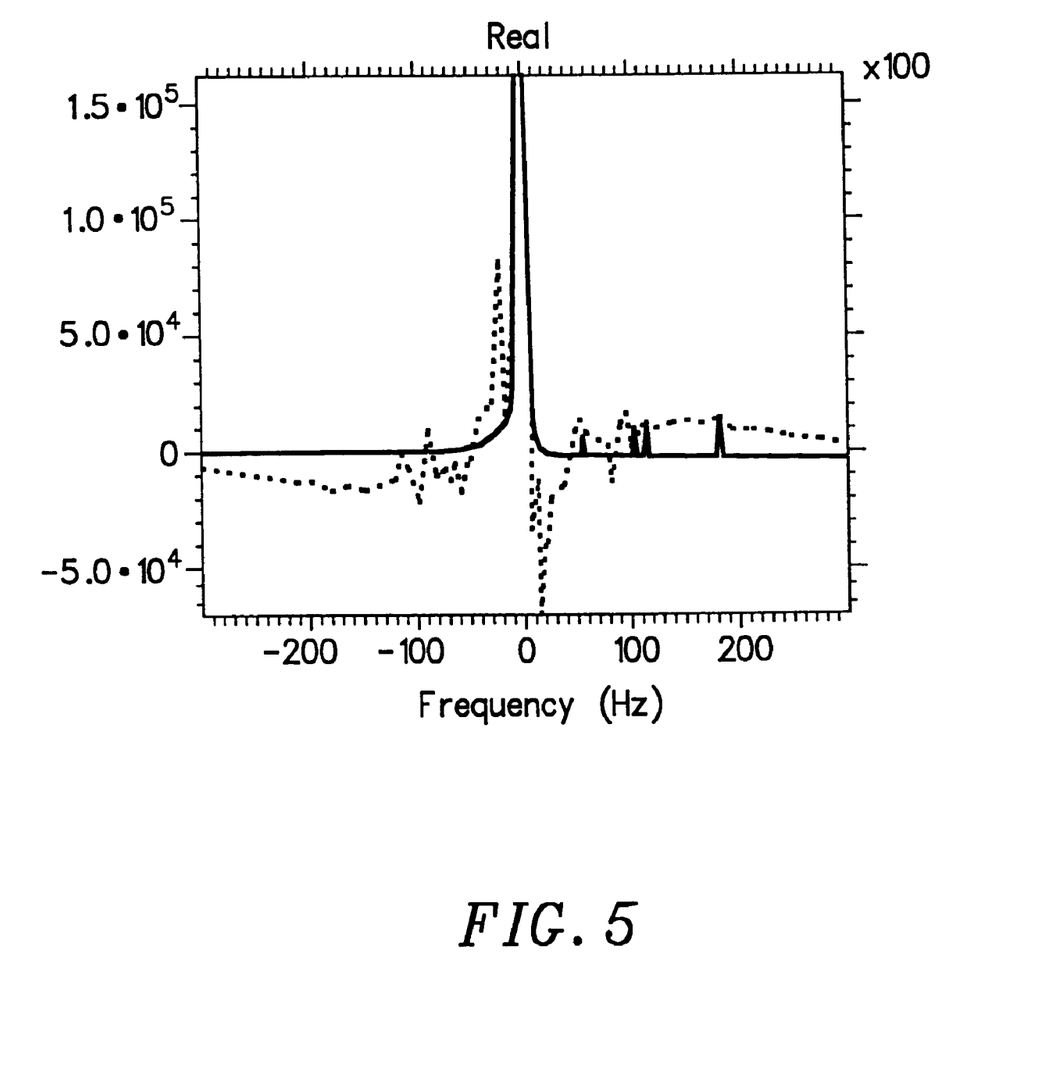
FIG. 5 is a "J0 Spectrum" (F2 trace at F1=0) of MRS HD sphere (solid line) plotted on top of conventional PRESS spectrum of the MRS HD sphere (dotted line).
Figure 6:
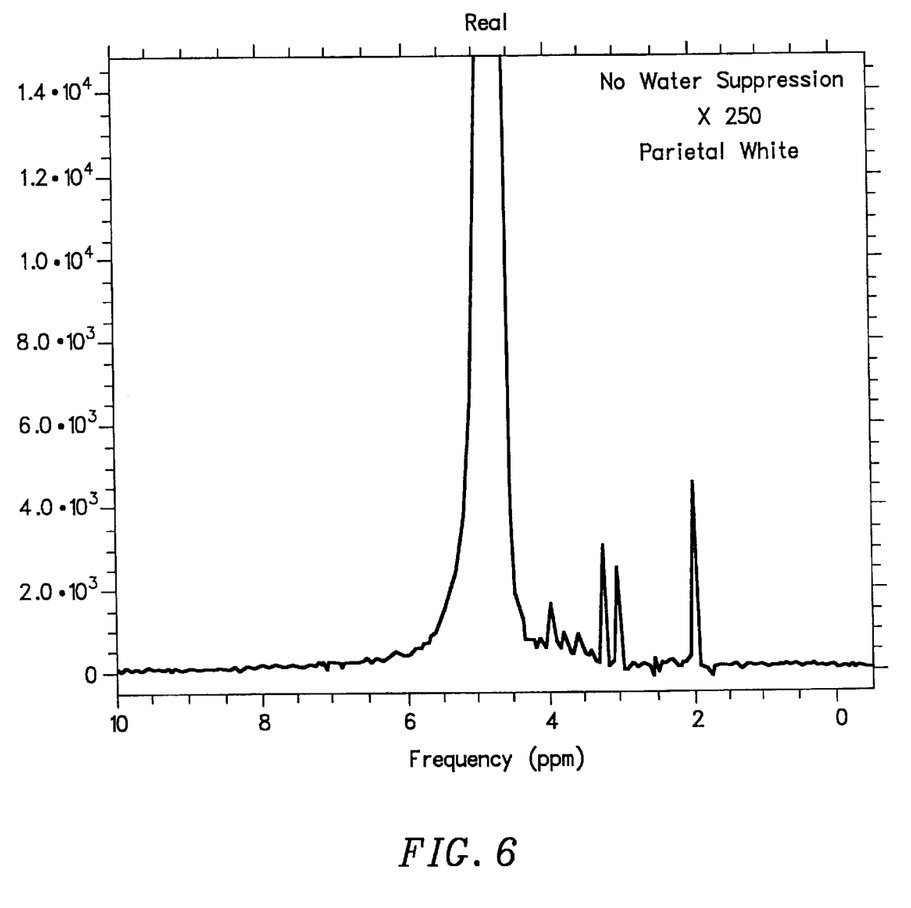
FIG. 6 is a J0 spectrum of in vivo ROI (parietal white matter) obtained without water suppression.
Figure 7A:
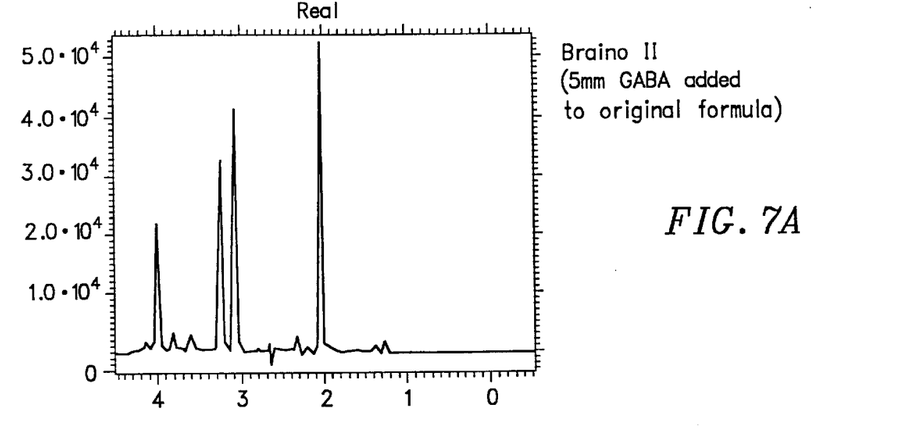
FIGS. 7A–7C are J0 spectra of a second generation MRS HD sphere with 5 mM GABA FIG. 7A, the original MRS HD sphere (a.k.a. Braino—FIG. 7B) and an occipital lobe in vivo ROI FIG. 7C).
Figure 7B:
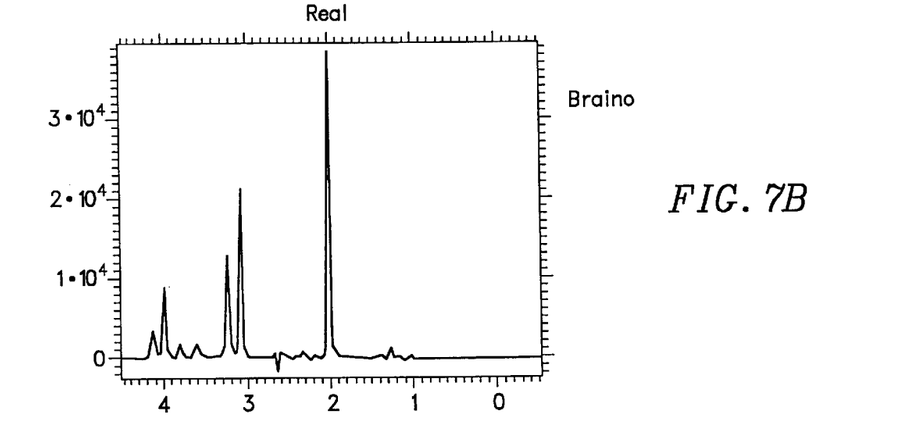
Figure 7C:
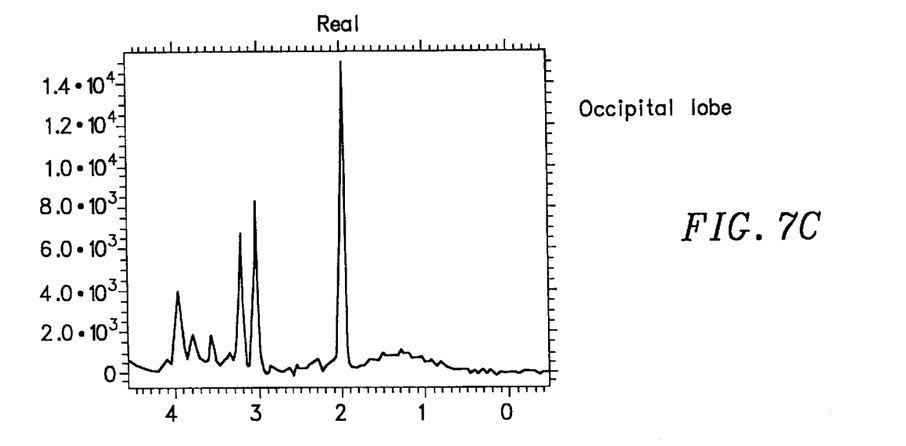

Water suppression is perhaps the most restrictive aspect of in vivo proton spectroscopy and spectroscopic imaging. The potential loss of signals and the impact of spin coupling are common problems which are aggravated in many cases by even modest in-homogeneity. Water suppression, however, has been a requirement in prior art due to water side band artifacts which are an issue for even relatively well suppressed water on some systems. In these studies, separate unsuppressed water spectra must be acquired in addition to the water suppressed data for quantitation, line shape correction and artifact reduction methods. Without suppression, these side band artifacts, which scale with water intensity, completely obscure the metabolic peaks on virtually all systems. This is clearly evident in FIG. 3 which shows a PRESS (TE 35) spectrum acquired without water suppression. Vertical expansion of 100 shows both the broad and discrete water side bands which, although 1% or less completely obscure the metabolite spectra observed between 30 Hz and 230 Hz. Fortunately, as illustrated in FIG. 4, oversampled J-Resolved 2D spectroscopy overcomes this obstacle. Data were collected as a 128×1K array (200 Hz×1000 Hz). A 100× vertical expansion shows the artifacts resolved at F1=F2 and at F1=F2/2 as well as the metabolite peaks between +/−12 Hz. In this stack plot of a 128×1K (200 Hz×1kHz) J-Resolved spectrum, the offending baseline artifacts are clearly resolved in F1. These artifacts appear at either F1=F2 (presumably due to gradient effects prior to, or just after the 90 degree slice selection), or appear at F1=F2/2 (presumably due to coupling effects from gradients around the final 180 refocusing pulse and hence subject to only half of t1-evolution time). FIG. 5 shows the F1=0 J-resolved spectrum (solid line, and henceforth referred to as the J0 spectrum) overlaid on a conventional PRESS spectrum (dotted line), both unsuppressed and displayed at a vertical expansion of 100. Notice that the conventional PRESS spectrum has both discrete and broad baseline distortions that are clearly not present in the over-sampled J0 spectrum. FIG. 6 shows an in vivo (parietal white) over-sample J0 spectrum at a vertical expansion of 250. Note the excellent line shape and absence of artifacts in this spectrum acquired without any water suppression. FIGS. 7A–7C show J0 spectra for a second generation MRS HD sphere containing 5 mM GABA FIG. 7A, the original MRS HD sphere FIG. 7B and an occipital lobe in vivo ROI FIG. 7C.

The strong water line can be used not only for phase and residual eddy current correction of each ti increment of the water t2 signal but it can also be used to correct for the water t2 signal as a function of F1 (F1, t2). This generates a 2D pure absorption line shape for the uncoupled spins and fixes the phases of the coupled signals at F1 not equal to θ Hz. This referencing also eliminates very long time constant Bo eddy currents and other unwanted phase and frequency changes that occur during the course of the total duration of acquisition. The line shape is approximately $1/T_2^*$ in F2 and $1/T_2$ in F1. This step allows the phase sensitive (F1, F2) map to be fit to phase sensitive (F1, F2) model spectra.

Figures 8A, 8B, 8C:
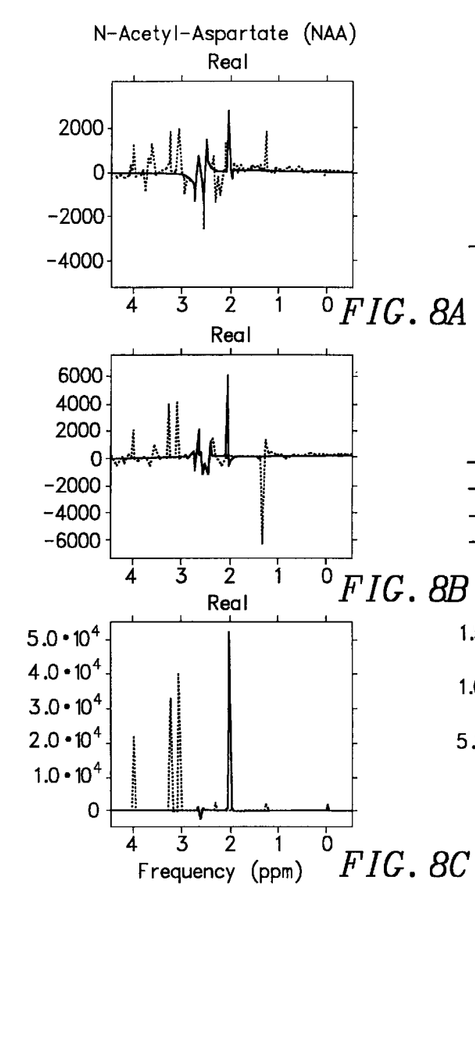
FIGS. 8A–8C, 8D–8F and 8G–8I respectively are J0, J3 and J6 spectra of NAA, Lactate, and myo-Inositol solutions (solid lines) plotted on J0, J3 and J6 spectra of the second generation MRS HD sphere.
Figures 8D, 8E, 8F, 8G, 8H, 8I:
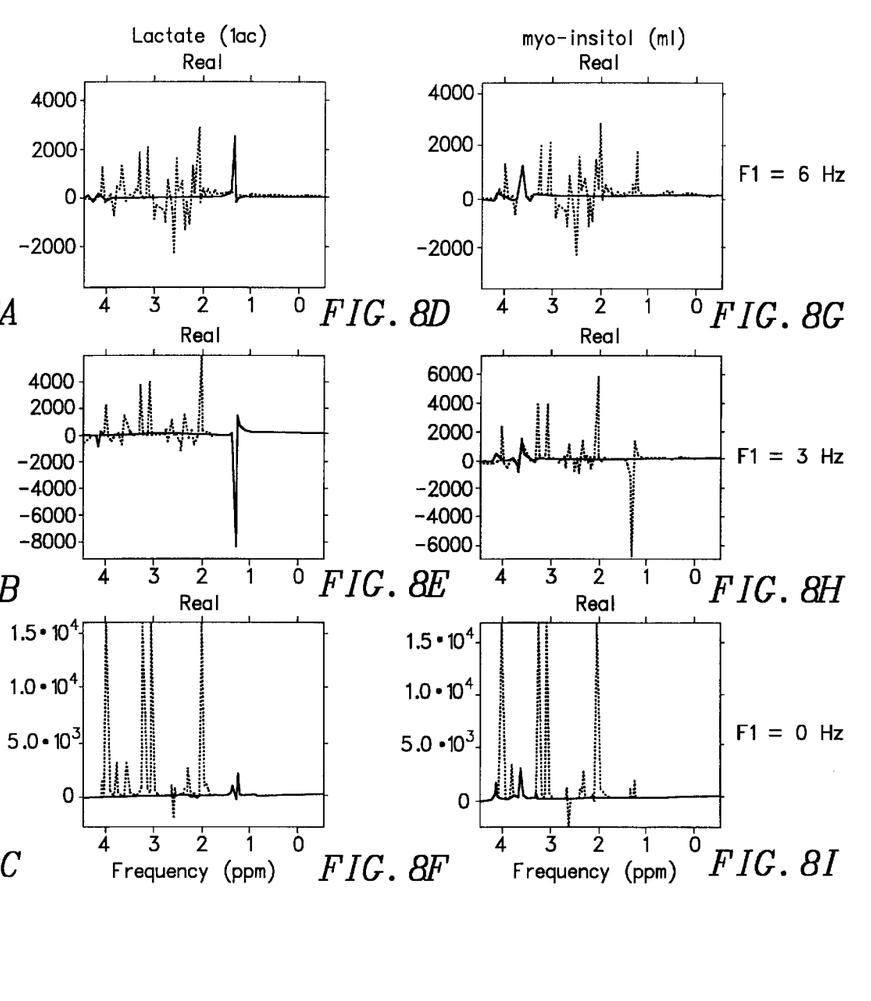
Figure 9A:
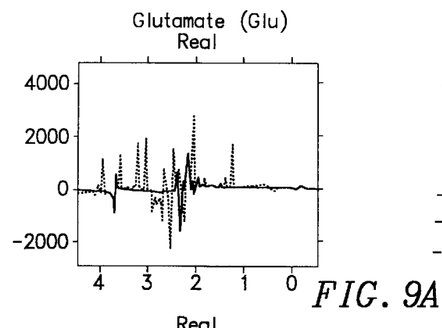
FIGS. 9A–9C, 9D–9F, 9G–9I respectively are J0, J3 and J6 spectra of glutamate, GABA, and glutamine solutions (solid lines) plotted on J0, J3 and J6 spectra of the second generation MRS HD sphere.
Figure 9B:
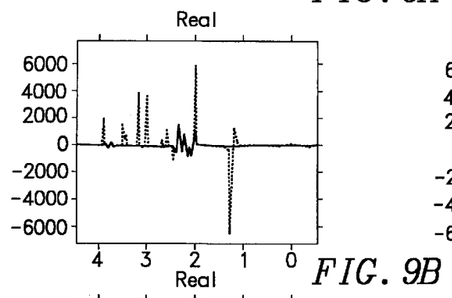
Figure 9C:
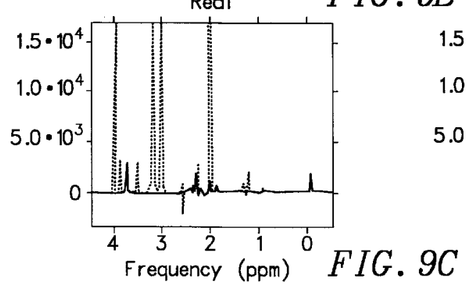
Figures 9D, 9G:
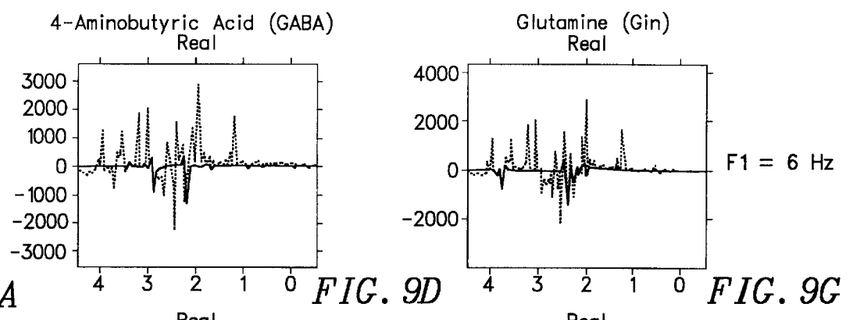
Figures 9E, 9H:
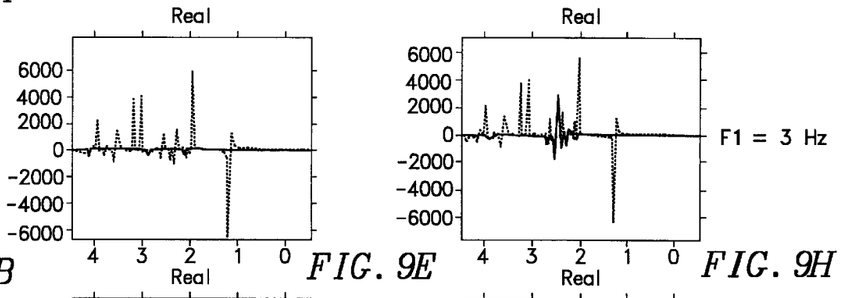
Figures 9F, 9I:
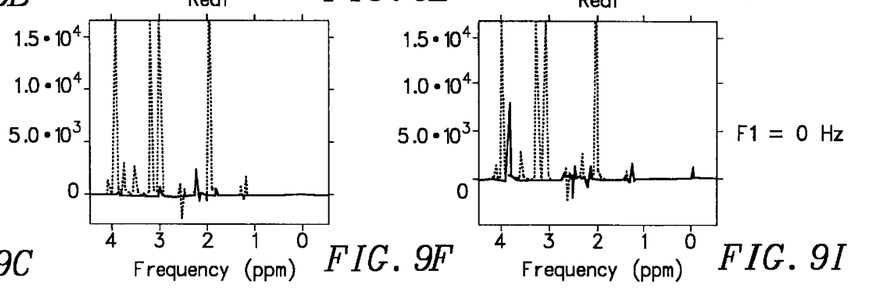

The resulting 2D arrays contain discrete patterns for each of the individual chemicals that make up the vivo brain spectra and are ideal for fitting to model spectra 2D arrays. The added F1 resolution makes it possible to improve the fit of almost all of the metabolites. This is illustrated by the 1D J0, J3 and J6 model spectra (solid lines) overlayed on the second generation MRS HD sphere (dotted line) shown in FIGS. 8A and 8C (NAA), FIGS. 8D–8F (Lactate), FIGS. 8G–8I (Mayo-Inositol), FIGS. 9A–9C (Glu), 9D–9F (GABA) and FIGS. 9G–9I (Gla). For example, consider NAA which is overlapped with GLN and GLU in conventional PRESS TE 35 spectra. In oversampled 2D J spectroscopy the NAA methyl is well resolved in the J0 spectrum and provide very characteristic patterns for the methylene signals in the J6 spectrum. Lactate is edited in the J3 spectrum. The separation of GLN, GLU and GABA, a losing proposition in normal unedited PRESS spectra, is another good example. Even with just 10 spectra the separation is good. GLN and GLU overlap at 3.8 ppm, but are separated by the intensities at 2.35 ppm. GABA and GLU overlap at 2.35 ppm but are separable by the ratio of the 3.8 ppm:2.35 ppm signals. Confirmation of the GABA quantitation comes from the J6 spectrum where the GABA alone is found as a partially inverted signal at 2.95 ppm. Of course the fit of the 2D array with 2D array model spectra is much more specific than these simple illustrative 1D examples. The fit of (t1, F2) data provides estimates of actual metabolite $T_2$'s and using the method of Kreis et al., Journal of Magnetic Resonance B102:9; 1993, the water $T_2$ measurement can be used to estimate CSF partial volume and brain water content.

There has been described an improved method for quantitative in vivo spectroscopy employing F1 oversampling to resolve and eliminate unwanted coherent side bands of water that give rise to artifacts in the spectral range of interest and provides the raw data to extract metabolite and water $T_2$ relaxation decays (t1, F2) and resolve the crowded proton spectrum in two frequency dimensions. The water line shape can be used for referencing in two dimensions to generate pure absorption two dimensional line shapes for uncoupled spins and correct for residual low frequency eddy current effects. Further, 2D J-Resolved model metabolite spectra can be fitted to resulting phase sensitive 2D-J Resolved in vivo data, along with (t1, F2) estimation of metabolite T2 relaxation and biexponential fit of (t1, F2) water signal to estimate CSF partial volume and water content. The invention can be applied as a single voxel quantitative brain exam or an acquisition time encoded fast spectroscopic imaging exam.

Thus, while the invention has been described with reference to specific embodiments and applications, the description is illustrative of the invention and not limiting the invention. Various modifications and applications may occur to those skilled in the art without departing from the true spirit and scope of the invention as defined by the appended claims.

What is claimed is:

1. A method of magnetic resonance spectroscopy comprising the steps of:
    a) placing an object in a magnetic field,
    b) generating and refocusing transverse magnetization to create echo signals at an echo time, TE,
    c) incrementing TE in steps to acquire a 2D data set, including incrementing TE in an F1 bandwidth greater than the bandwidth of proton-proton J-coupling, and sufficient to discretely sample artifacts at F1 frequencies greater than the J-coupling bandwidth,
    d) processing the data set to obtain chemical shift and J-coupling frequencies along an F2 axis and J-coupling frequencies along an F1 axis.

2. The method as defined by claim 1 wherein proton-proton J-coupling is a maximum of 25 Hz and the F1 bandwidth is at least 100 Hz.

3. The method as defined by claim 2 wherein the F1 bandwidth is at least 200 Hz.

4. The method as defined by claim 2 wherein a 2D water signal is resolved and used for correction of phase as a function of t2 both prior to and after FFT in t1.

5. The method as defined by claim 4 wherein phase sensitive model spectra are used to fit the phase sensitive oversampled J-Resolved data.

6. The method as defined by claim 1 wherein a 2D water signal is resolved and used for correction of the signals as a function of t2 both prior to and after FFT in F1.

7. The method as defined by claim 6 wherein phase sensitive model spectra are used to fit the phase sensitive oversampled J-Resolved data.

* * * * *